United States Patent
Ishibashi

(10) Patent No.: US 9,466,512 B2
(45) Date of Patent: Oct. 11, 2016

(54) SUBSTRATE CLEANING APPARATUS AND SUBSTRATE PROCESSING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/573,390

(22) Filed: Dec. 17, 2014

(65) Prior Publication Data

US 2015/0179484 A1    Jun. 25, 2015

(30) Foreign Application Priority Data

Dec. 25, 2013   (JP) .................................. 2013-267679

(51) Int. Cl.
*B24B 37/00* (2012.01)
*H01L 21/67* (2006.01)
*B24B 37/34* (2012.01)

(52) U.S. Cl.
CPC ......... *H01L 21/67046* (2013.01); *B24B 37/34* (2013.01); *H01L 21/67051* (2013.01)

(58) Field of Classification Search
CPC ... B24B 37/34; B24B 53/017; B24B 53/007; B24B 53/12; B24B 53/00; B24B 53/10; B08B 3/02; B08B 1/007; E01H 1/103; H01L 21/67051
USPC ................ 451/73, 67, 444; 15/77, 88.2, 102
See application file for complete search history.

(56) References Cited

U.S. PATENT DOCUMENTS

| 5,471,726 | A | * | 12/1995 | Kaiser | ..................... | B08B 1/007 15/1 |
| 5,651,160 | A | * | 7/1997 | Yonemizu | ............... | B08B 1/007 134/902 |
| 5,778,480 | A | * | 7/1998 | Nittinger | ................ | A61C 19/00 15/210.1 |
| 5,868,866 | A | * | 2/1999 | Maekawa | ............... | B08B 1/007 134/1 |
| 6,439,962 | B1 | * | 8/2002 | Ato | ........................... | B08B 1/04 451/6 |
| 6,997,782 | B2 | * | 2/2006 | Nishi | ........................ | B08B 1/04 451/41 |
| 7,367,873 | B2 | * | 5/2008 | Ishii | ........................ | B24B 9/065 451/168 |
| 2002/0022445 | A1 | * | 2/2002 | Sotozaki | .................. | B08B 1/04 451/444 |

(Continued)

FOREIGN PATENT DOCUMENTS

JP   08-071511 A    3/1996
JP   EP 0764478 A1 *   3/1997   ............... B08B 1/00

(Continued)

*Primary Examiner* — George Nguyen
(74) *Attorney, Agent, or Firm* — Pearne & Gordon LLP

(57) ABSTRACT

A substrate cleaning apparatus which can sufficiently clean a pen-sponge in its entirety, and can prevent particles, which have been once removed, from being reattached to the pen-sponge is disclosed. The substrate cleaning apparatus includes: a substrate holder configured to hold and rotate a substrate; a sponge cleaning tool to be brought into contact with a surface of the substrate; a cleaning element provided adjacent to the substrate held by the substrate holder; and a cleaning-tool moving mechanism configured to bring the sponge cleaning tool into contact with the cleaning element. The cleaning element has a cleaning surface that is to come in contact with the sponge cleaning tool, and a central portion of the cleaning surface is located at a higher position than a portion, of the cleaning surface, outside the central portion.

16 Claims, 14 Drawing Sheets

(56) References Cited

U.S. PATENT DOCUMENTS

| | | | |
|---|---|---|---|
| 2002/0189641 A1* | 12/2002 | Sato | B08B 1/04 134/6 |
| 2004/0087258 A1* | 5/2004 | Kimura | B24B 37/345 451/67 |
| 2004/0211959 A1* | 10/2004 | Kajita | H01L 21/67051 257/48 |
| 2005/0241946 A1* | 11/2005 | Nagai | C25D 3/38 205/93 |
| 2006/0086616 A1* | 4/2006 | Kurashina | C25D 5/22 205/83 |
| 2006/0194521 A1* | 8/2006 | Kamimura | B24B 29/005 451/56 |
| 2008/0085658 A1* | 4/2008 | Katsuoka | B24B 37/04 451/7 |
| 2008/0173337 A1* | 7/2008 | Lamb | A47L 11/00 134/154 |
| 2012/0298148 A1* | 11/2012 | McLain | B24B 53/007 134/33 |

FOREIGN PATENT DOCUMENTS

| | | |
|---|---|---|
| JP | 09-092633 A | 4/1997 |
| JP | 10-109074 A | 4/1998 |

* cited by examiner

SUBSTRATE CLEANING APPARATUS AND SUBSTRATE PROCESSING APPARATUS

CROSS REFERENCE TO RELATED APPLICATION

This document claims priority to Japanese Patent Application Number 2013-267679 filed Dec. 25, 2013, the entire contents of which are hereby incorporated by reference.

BACKGROUND

As semiconductor devices have been becoming finer in recent years, various material films having different properties are formed on a substrate, and are processed. In particular, in a damascene interconnect forming process in which interconnect trenches formed in a dielectric film are filled with a metal, an excessive metal is polished away by a polishing apparatus after a metal film is formed. Various films, such as a metal film, a barrier film, and a dielectric film, are exposed on a wafer surface that has been polished. Residues, such as slurry used in polishing and polishing debris, remain on these films that are exposed on the wafer surface. In order to remove these residues, the polished wafer is transported to a substrate cleaning apparatus, where the wafer surface is cleaned.

If the cleaning of the wafer surface is insufficient, reliability problems, such as poor adhesion and a current leak due to the existence of the residues, may occur. Therefore, in manufacturing of a semiconductor device, cleaning of the wafer has been an important process for improving a yield of products.

A substrate cleaning apparatus of pen-type is known as the aforementioned substrate cleaning apparatus. The substrate cleaning apparatus of this pen-type is configured to clean a wafer by bringing a pen-sponge into sliding contact with a surface of the wafer while supplying cleaning liquid (e.g., chemical liquid or pure water) onto the surface of the wafer. More specifically, the pen-sponge is moved on the wafer surface while being rotated about an axis of the pen-sponge. The surface of the wafer is cleaned by the pen-sponge in the presence of the cleaning liquid.

As the cleaning of the wafer with use of the pen-sponge is repeated, particles, such as abrasive grains contained in a polishing liquid and/or polishing debris, are accumulated in the pen-sponge. Therefore, as shown in FIG. 16, in order to clean a pen-sponge 200, a cleaning element 201 is provided adjacent to the wafer. This cleaning element 201 has a flat cleaning surface 201a. The pen-sponge 200 is pressed against the cleaning surface 201a of the cleaning element 201 while the pen-sponge 200 is being rotated about its own axis. Further, pure water is supplied onto the cleaning surface 201a of the cleaning element 201. In this state, the pen-sponge 200 is cleaned by sliding contact with the cleaning element 201.

However, since the pen-sponge 200 is pressed against the flat cleaning surface 201a of the cleaning element 201, a central area of the pen-sponge 200 may not be cleaned sufficiently. In addition, the particles that have been once removed from the pen-sponge 200 and moved to the cleaning element 201 may be attached again to the pen-sponge 200.

SUMMARY OF THE INVENTION

There is provided a substrate cleaning apparatus which can sufficiently clean a pen-sponge in its entirety, and can prevent particles, which have been once removed, from being reattached to the pen-sponge. Further, there is provided a substrate processing apparatus incorporating such a substrate cleaning apparatus.

Embodiments, which will be described below, relate to a substrate cleaning apparatus that cleans a substrate such as a wafer, and particularly a substrate cleaning apparatus that cleans a substrate by scrubbing a surface of a polished substrate with a sponge cleaning element. The substrate cleaning apparatus according to the embodiments can be applied to cleaning of a wafer having a diameter of 300 mm, as well as cleaning of a wafer having a diameter of 450 mm. Furthermore, the substrate cleaning apparatus according to the embodiments can be applied to a fabrication process of a flat-panel, a fabrication process of an image sensor, such as CMOS and CCD, a fabrication process of a magnetic film of MRAM, and the like.

In an embodiment, there is provided a substrate cleaning apparatus comprising: a substrate holder configured to hold and rotate a substrate; a sponge cleaning tool to be brought into contact with a surface of the substrate; a cleaning element provided adjacent to the substrate held by the substrate holder; and a cleaning-tool moving mechanism configured to bring the sponge cleaning tool into contact with the cleaning element, the cleaning element having a cleaning surface that is to come in contact with the sponge cleaning tool, and a central portion of the cleaning surface being located at a higher position than a portion, of the cleaning surface, outside the central portion.

In an embodiment, the portion outside the central portion is a slope portion extending outwardly from the central portion and inclined downwardly.

In an embodiment, a plurality of radially extending grooves are formed on the cleaning surface.

In an embodiment, the cleaning element has a central outlet located in the central portion of the cleaning surface, and a fluid passage communicating with the central outlet, and a fluid supply line, which is configured to supply fluid to the fluid passage, is coupled to the cleaning element.

In an embodiment, the fluid supply line is a liquid supply line configured to supply a liquid to the fluid passage.

In an embodiment, the fluid supply line is a two-fluid supply line configured to supply two fluids to the fluid passage.

In an embodiment, a gas supply line configured to supply a gas to the fluid passage is further coupled to the cleaning element.

In an embodiment, the cleaning element further has outer outlets provided outside the central portion of the cleaning surface, and the outer outlets communicate with the fluid passage.

In an embodiment, the cleaning-tool moving mechanism is configured to bring the sponge cleaning tool into contact with the cleaning element when the sponge cleaning tool is rotating about its central axis.

In an embodiment, there is provided a substrate processing apparatus comprising: a polishing unit configured to polish a substrate; and a substrate cleaning apparatus configured to clean the substrate polished by the polishing unit, the substrate cleaning apparatus including: (i) a substrate holder configured to hold and rotate the substrate; (ii) a sponge cleaning tool to be brought into contact with a surface of the substrate; (iii) a cleaning element provided adjacent to the substrate held by the substrate holder; and (iv) a cleaning-tool moving mechanism configured to bring the sponge cleaning tool into contact with the cleaning element, the cleaning element having a cleaning surface that is to come in contact with the sponge cleaning tool, and a central portion of the cleaning surface being located at a higher position than a portion, of the cleaning surface, outside the central portion.

The central portion of the cleaning element is located at a higher position than the other portion. With this configuration, a central area of the sponge cleaning tool is pressed more strongly against the cleaning element than other areas, so that particles, such as abrasive grains, polishing debris, and the like, which have entered inside of the central area of the sponge cleaning tool can be removed. Since a portion outside the central portion of the cleaning element is located at a lower position than the central portion, the particles that have been once removed from the sponge cleaning tool flow down quickly, together with pure water, on the cleaning element. Therefore, the particles can be prevented from being reattached to the sponge cleaning tool. Moreover, since the cleaning performance of the sponge cleaning tool is maintained for a long time, a replacement frequency of the sponge cleaning tool is lowered. As a result, costs can be lowered. In addition, an operation stop time of the substrate cleaning apparatus for replacement of the sponge cleaning tool can be reduced.

DESCRIPTION OF EMBODIMENTS

Figure 1:
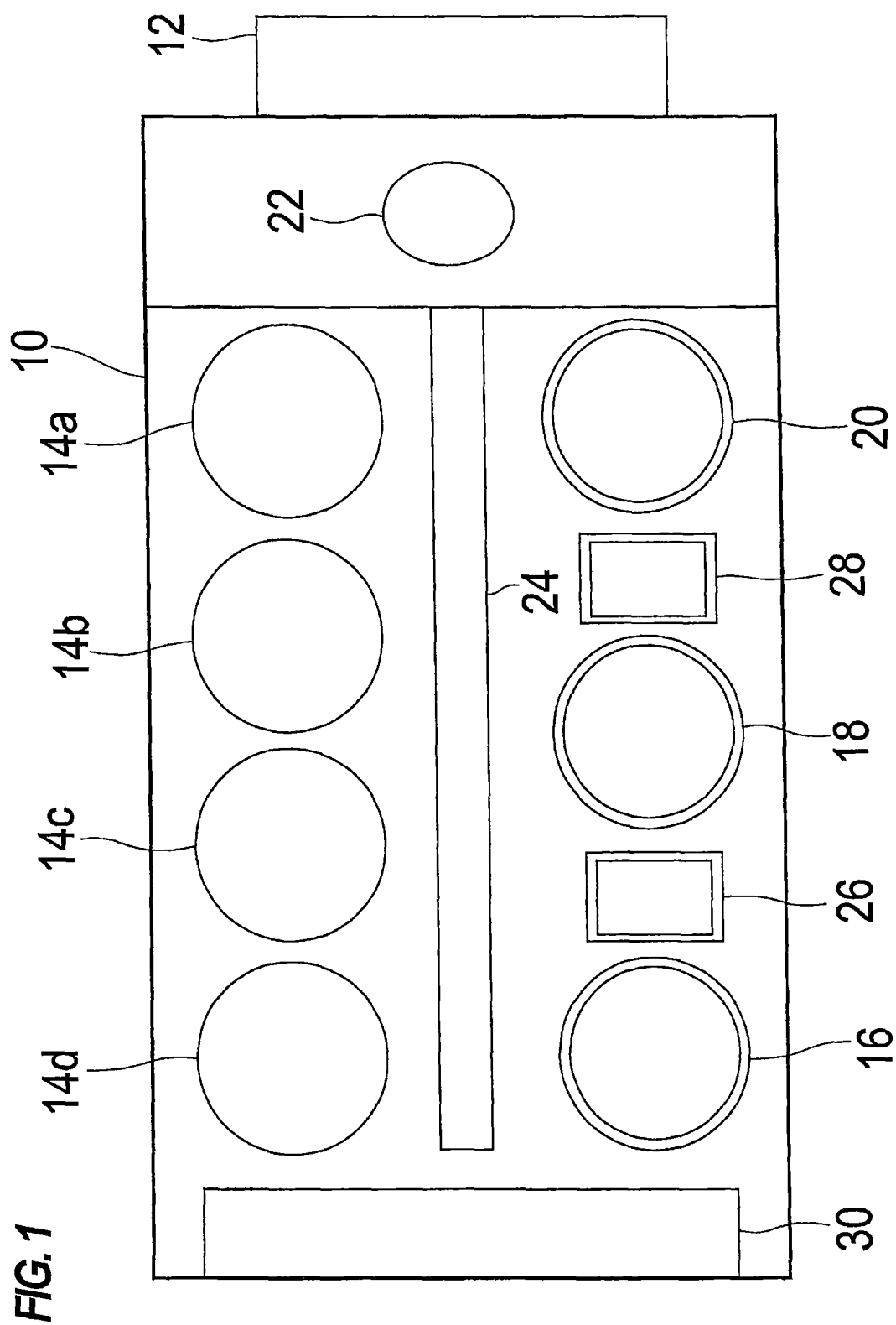
FIG. 1 is a plan view showing a whole structure of a substrate processing apparatus incorporating a substrate cleaning apparatus according to an embodiment.

Embodiments will now be described with reference to the drawings. FIG. 1 is a plan view showing a whole structure of a substrate processing apparatus incorporating a substrate cleaning apparatus according to an embodiment. As shown in FIG. 1, the substrate processing apparatus includes an approximately-rectangular housing 10, and a loading port 12 on which a substrate cassette is placed. The substrate cassette houses therein a large number of substrates, such as wafers. The loading port 12 is disposed adjacent to the housing 10. The loading port 12 can be mounted with an open cassette, a SMIF (Standard Manufacturing Interface) pod, or a FOUP (Front Opening Unified Pod). Each of the SMIF and the FOUP is an airtight container which houses a substrate cassette therein and which, by covering it with a partition wall, can keep its internal environment isolated from the external environment.

In the housing 10, there are disposed a plurality of (four in this embodiment) polishing units 14a, 14b, 14c, 14d for polishing a substrate, a first cleaning unit 16 and a second cleaning unit 18 each for cleaning a polished substrate, and a drying unit 20 for drying the cleaned substrate. The polishing units 14a, 14b, 14c, 14d are arranged along a longitudinal direction of the substrate processing apparatus, and the cleaning units 16, 18 and the drying unit 20 are also arranged along the longitudinal direction of the substrate processing apparatus.

A first substrate transfer robot 22 is disposed in an area surrounded by the loading port 12, the polishing unit 14a, and the drying unit 20. Further, a substrate transport unit 24 is disposed parallel to the polishing units 14a, 14b, 14c, 14d. The first substrate transfer robot 22 receives a substrate, to be polished, from the loading port 12 and transfers the substrate to the substrate transport unit 24, and receives a dried substrate from the drying unit 20 and returns the dried substrate to the loading port 12. The substrate transport unit 24 transports a substrate received from the first substrate transfer robot 22, and transfers the substrate to and from the polishing units 14a, 14b, 14c, 14d. Each of the polishing units 14a, 14b, 14c, 14d is configured to polish a surface of a substrate, such as a wafer, by bringing the substrate into sliding contact with a polishing surface while supplying polishing liquid (slurry) onto the polishing surface.

A second substrate transfer robot 26 for transporting a substrate between the cleaning units 16, 18 and the substrate transport unit 24 is provided between the first cleaning unit 16 and the second cleaning unit 18. A third substrate transfer robot 28 for transporting a substrate between the second cleaning unit 18 and the drying unit 20 is provided between these units 18, 20. Further, an operation controller 30 for controlling operations of each unit of the substrate processing apparatus is provided in the housing 10.

The first cleaning unit 16 is a substrate cleaning apparatus configured to clean a substrate by scrubbing both a front surface and a rear surface of the substrate with roll-sponges in the presence of a cleaning liquid. The second cleaning unit 18 is a substrate cleaning apparatus of pen-type according to an embodiment. The drying unit 20 is a spin drying apparatus configured to hold a substrate, eject IPA vapor from a moving nozzle to dry the substrate, and rotate the substrate at a high speed to further dry the substrate.

The substrate is polished by at least one of the polishing units 14a through 14d. The polished substrate is cleaned by the first cleaning unit 16 and the second cleaning unit 18, and the cleaned substrate is then dried by the drying unit 20.

Figure 2:
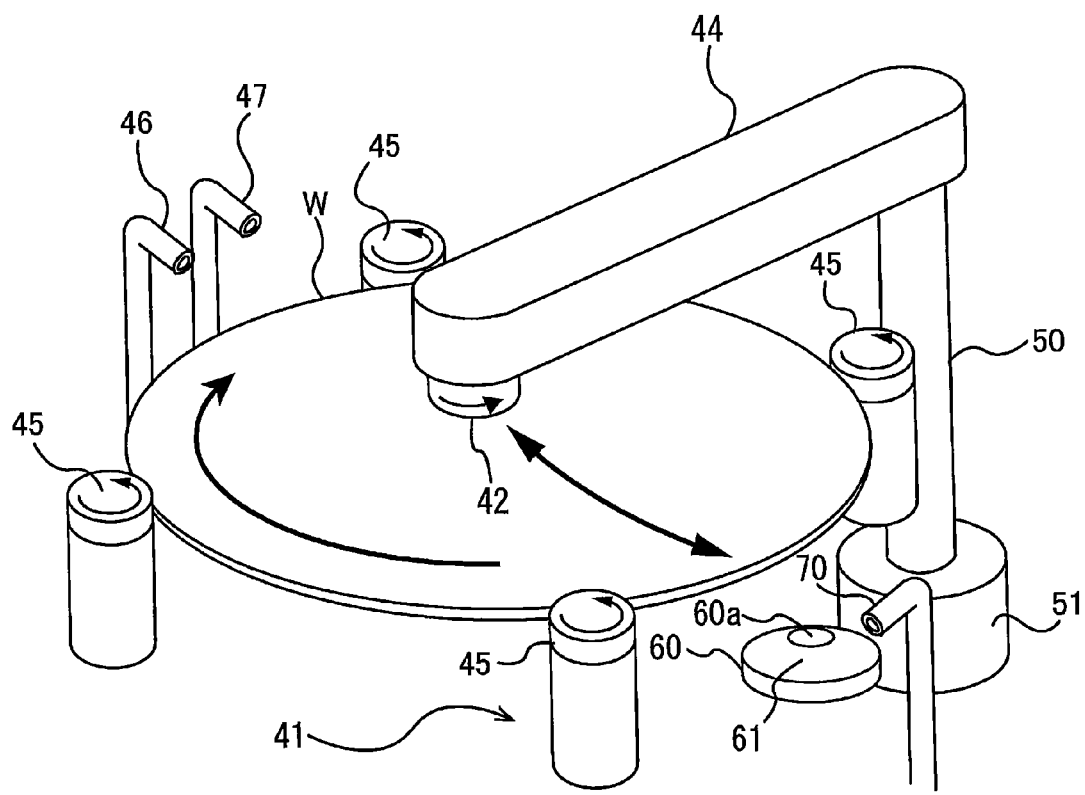
FIG. 2 is a perspective view showing a substrate cleaning apparatus of pen-sponge type according to an embodiment.

FIG. 2 is a perspective view showing a substrate cleaning apparatus of pen-sponge type, according to an embodiment, which is used as the second cleaning unit 18. As shown in FIG. 2, this type of substrate cleaning apparatus includes a substrate holder 41 for holding and rotating a wafer W which is an example of a substrate, a pen-sponge (or a sponge cleaning tool) 42 to be brought into contact with an upper surface of the wafer W, an arm 44 for holding the pen-sponge 42, a rinsing liquid supply nozzle 46 for supplying rinsing liquid (typically, pure water) onto the upper surface of the wafer W, and a cleaning liquid supply nozzle 47 for supplying cleaning liquid, such as chemical liquid, onto the upper surface of the wafer W. The pen-sponge 42 is coupled to a cleaning tool rotating mechanism (not shown) provided in the arm 44 so that the pen-sponge 42 is rotated about its central axis extending in a vertical direction.

The substrate holder 41 includes a plurality of (four in FIG. 2) rollers 45 each for holding a peripheral portion of the wafer W. These rollers 45 are configured to rotate in the same direction at the same speed. While the rollers 45 are holding the wafer W horizontally, these rollers 45 are rotated, thereby rotating the wafer W about its central axis in a direction indicated by arrow.

The arm 44 is disposed above the wafer W. The pen-sponge 42 is coupled to one end of the arm 44, and a pivot shaft 50 is coupled to the other end of the arm 44. The pen-sponge 42 is coupled to a cleaning-tool moving mechanism 51 via the arm 44 and the pivot shaft 50. More specifically, the pivot shaft 50 is coupled to the cleaning-tool moving mechanism 51 for causing the arm 44 to pivot. The cleaning-tool moving mechanism 51 is configured to rotate the pivot shaft 50 through a predetermined angle to thereby cause the arm 44 to pivot in a horizontal plane that is parallel to the wafer W. As the arm 44 pivots, the pen-sponge 42 supported by the arm 44 is moved in radial direction of the wafer W. The cleaning-tool moving mechanism 51 is further configured to be able to move the pivot shaft 50 in the vertical direction to thereby press the pen-sponge 42 against the upper surface of the wafer W at a predetermined pressure. The pen-sponge 42 has a lower surface that constitutes a flat scrubbing surface, which is brought into sliding contact with the upper surface of the wafer W.

Cleaning of the wafer W is performed as follows. First, the wafer W is rotated about the central axis thereof. Then, the cleaning liquid is supplied from the cleaning liquid supply nozzle 47 onto the upper surface of the wafer W. In this state, the pen-sponge 42 is pressed against the upper surface of the wafer W, while the pen-sponge 42 is being rotated. Further, the pen-sponge 42 oscillates in the radial direction of the wafer W. The pen-sponge 42 is placed in sliding contact with the upper surface of the wafer W in the presence of the cleaning liquid to thereby scrub-clean the wafer W. After the scrub-cleaning, the rinsing liquid is supplied from the rinsing liquid supply nozzle 46 onto the upper surface of the rotating wafer W to rinse off the cleaning liquid from the wafer W.

The pen-sponge 42 is formed from a sponge which is a porous material. Therefore, as the cleaning of the wafer W is repeated, particles, such as abrasive grains and/or polishing debris, may be accumulated in the pen-sponge 42, thus possibly lowering cleaning performance. Thus, in order to remove the particles from the pen-sponge 42, the substrate cleaning apparatus further has a cleaning element 60 for cleaning the pen-sponge 42.

As shown in FIG. 2, the cleaning element 60 is located adjacent to the wafer W held by the substrate holder 41. The arm 44 is moved radially outwardly of the wafer W by the cleaning-tool moving mechanism 51 until the pen-sponge 42 reaches a position above the cleaning element 60. Then, the pen-sponge 42 is pressed against an upper surface (i.e., a cleaning surface) of the cleaning element 60 by the cleaning-tool moving mechanism 51 while the pen-sponge 42 is being rotated about its axis. A pure water supply nozzle 70 is provided adjacent to the cleaning element 60 so that pure water is supplied from the pure water supply nozzle 70 to the pen-sponge 42 when contacting the cleaning element 60.

Figure 3:
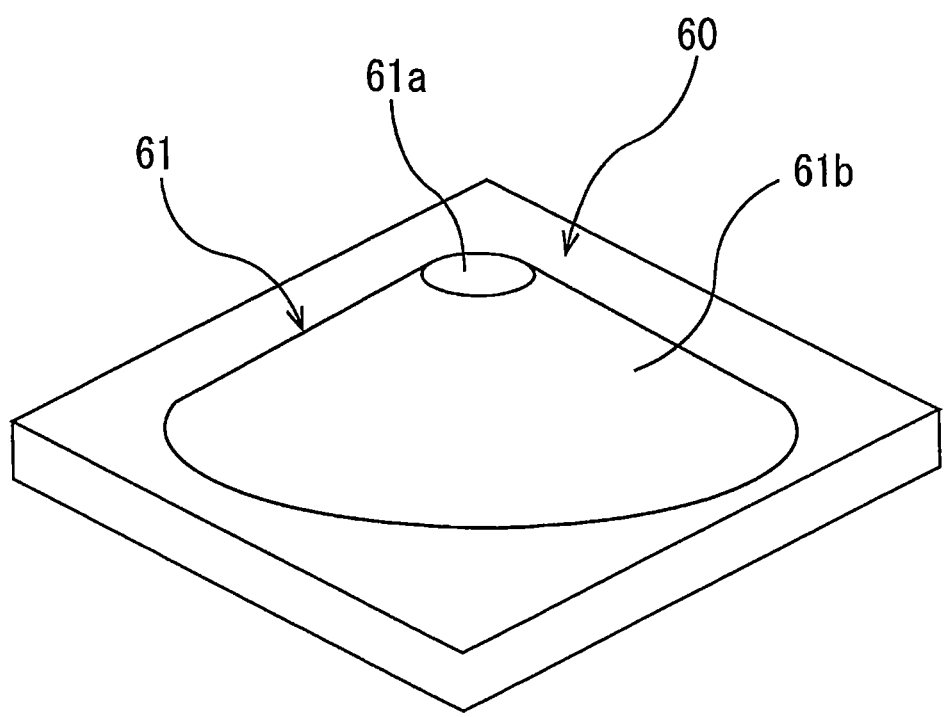
FIG. 3 is a perspective view of a cleaning element shown in FIG. 2.
Figure 4A:
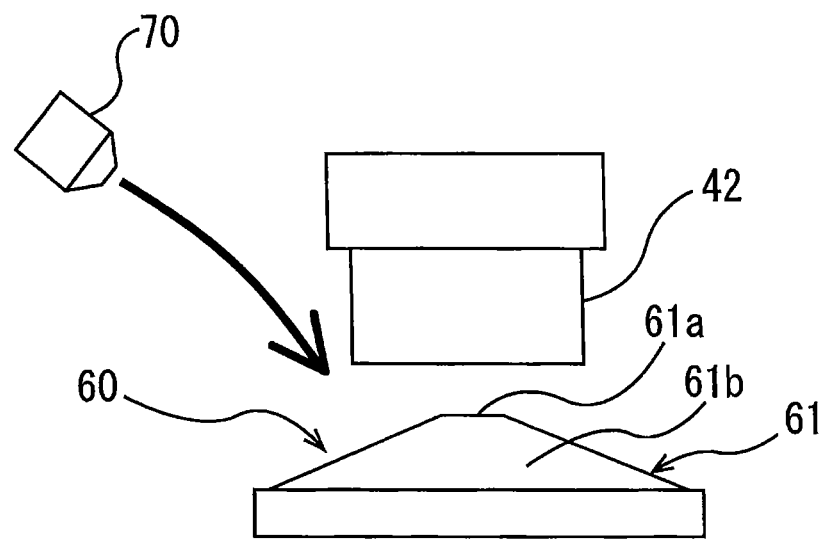
FIG. 4A is a side view showing the cleaning element and a pen-sponge.
Figure 4B:
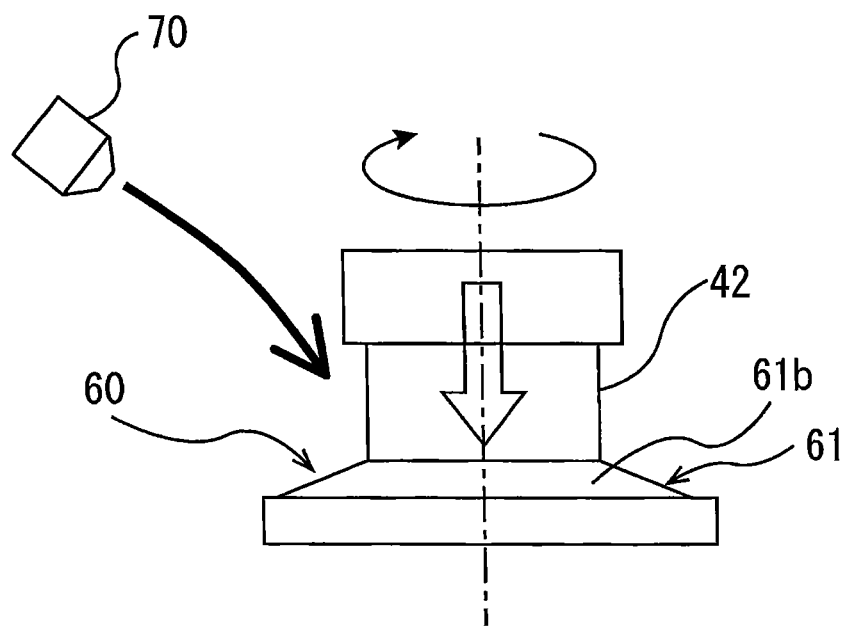
FIG. 4B is a side view showing the pen-sponge when pressed against the cleaning element.

FIG. 3 is a perspective view of the cleaning element 60 shown in FIG. 2. FIG. 4A is a side view showing the cleaning element 60 and the pen-sponge 42, and FIG. 4B is a side view showing the pen-sponge 42 when pressed against the cleaning element 60. The cleaning element 60 has a truncated cone shape. The upper surface of the cleaning element 60 constitutes a cleaning surface 61 that is to come in contact with the lower surface (i.e., the scrubbing surface) of the pen-sponge 42. The cleaning surface 61 of the cleaning element 60 includes a central portion 61a in a circular shape and a slope portion 61b. The slope portion 61b extends outwardly from the central portion 61a and is inclined downwardly. The slope portion 61b is in an annular shape.

The central portion 61a of the cleaning element 60 protrudes upwardly, and is located at a higher position than other portions (i.e., the slope portion 61b) that surround the central portion 61a. Therefore, when the pen-sponge 42 is lowered, a central area of the lower surface of the pen-sponge 42 is brought into contact with the protruding central portion 61a of the cleaning surface 61. When the pen-sponge 42 is further lowered, a circumferential area of the lower surface of the pen-sponge 42 is brought into contact with the slope portion 61b of the cleaning surface 61. In this manner, the entire lower surface of the pen-sponge 42 is brought into contact with the cleaning surface 61 of the cleaning element 60. The cleaning element 60 may be made of quartz, resin, polypropylene, or polybutylene terephthalate.

As shown in FIG. 4A and FIG. 4B, the pen-sponge 42 is pressed against the cleaning element 60 while the pen-sponge 42 is being rotated about the central axis of the pen-sponge 42 with its central axis aligned with the central axis of the cleaning element 60. While the pen-sponge 42 is pressed against the cleaning element 60, the pure water is supplied from the pure water supply nozzle 70 to the pen-sponge 42. In this manner, the pen-sponge 42 is cleaned with the pure water while the pen-sponge 42 is in sliding contact with the cleaning surface 61 of the cleaning element 60. In another embodiment, the pen-sponge 42 may be pressed against the upper surface (i.e., the cleaning surface) of the cleaning element 60 while the pen-sponge 42 is not rotated.

Since the cleaning element 60 is in the shape of truncated cone, the central portion 61a of the cleaning element 60 lies at a higher position than other portions (i.e., the slope portion 61b) surrounding the central portion 61a. With this configuration, the central area of the pen-sponge 42 is pressed more strongly against the cleaning element 60 than other areas of the pen-sponge 42, so that particles, such as abrasive grains, polishing debris, and the like, which have entered inside of the central area of the pen-sponge 42, can be removed. The particles that have been once removed from the pen-sponge 42 flow down rapidly, together with the pure water, on the slope portion 61b of the cleaning element 60. Therefore, the cleaning element 60 according to this embodiment can prevent the particles from being reattached to the pen-sponge 42. Moreover, since the cleaning performance of the pen-sponge 42 is maintained for a long time, a replacement frequency of the pen-sponge 42 is lowered. As a result, costs can be lowered. In addition, an operation stop time of the substrate cleaning apparatus for replacement of the pen-sponge 42 can be reduced.

Figure 5:
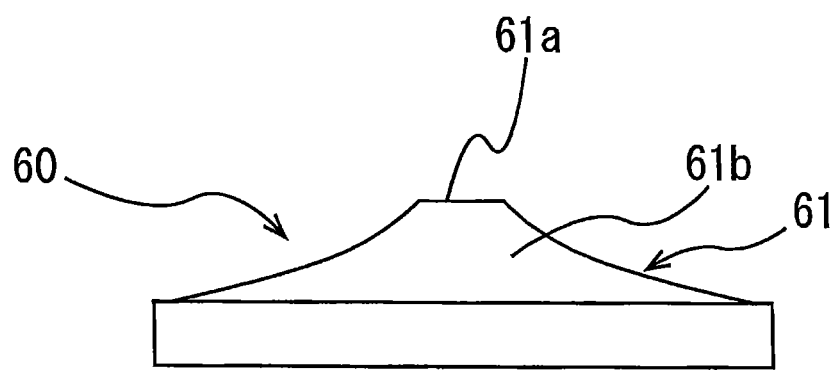
FIG. 5 is a side view showing another embodiment of the cleaning element.
Figure 6:
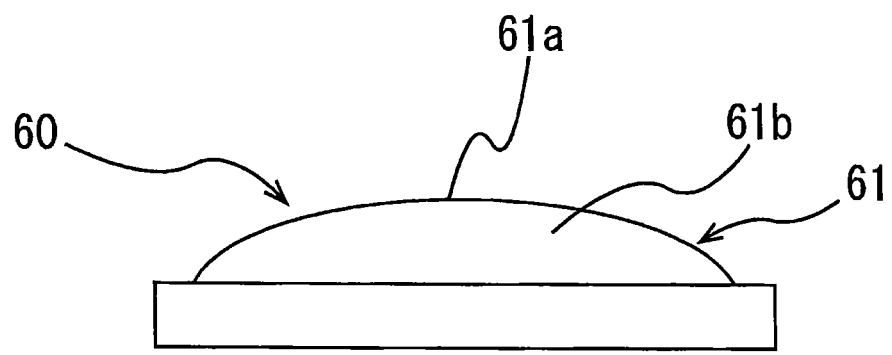
FIG. 6 is a side view showing still another embodiment of the cleaning element.
Figure 7:
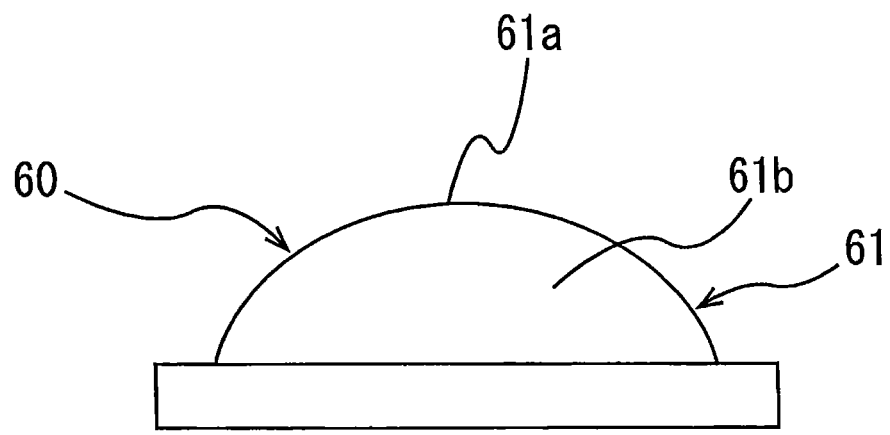
FIG. 7 is a side view showing still another embodiment of the cleaning element.

FIG. 5 is a side view showing another embodiment of cleaning element 60. Structures, which will not be described particularly, are the same as those shown in FIG. 3. The cleaning element 60 shown in FIG. 5 is in the shape of truncated cone that is identical to the cleaning element 60 shown in FIG. 3, but differs in that the slope portion 61b is curved inwardly. FIG. 6 is a side view showing still another embodiment of cleaning element 60. This cleaning element 60 shown in FIG. 6 is in the shape of a mound or dome. FIG. 7 is a side view showing still another embodiment of cleaning element 60. This cleaning element 60 shown in FIG. 7 is in the shape of a hemisphere. As with the cleaning element 60 shown in FIG. 3, the cleaning element 60 shown in any of FIGS. 5 through 7 has a shape such that central portion 61a of the cleaning surface 61 is higher than other portions (i.e., slope portion 61b).

Figure 8:
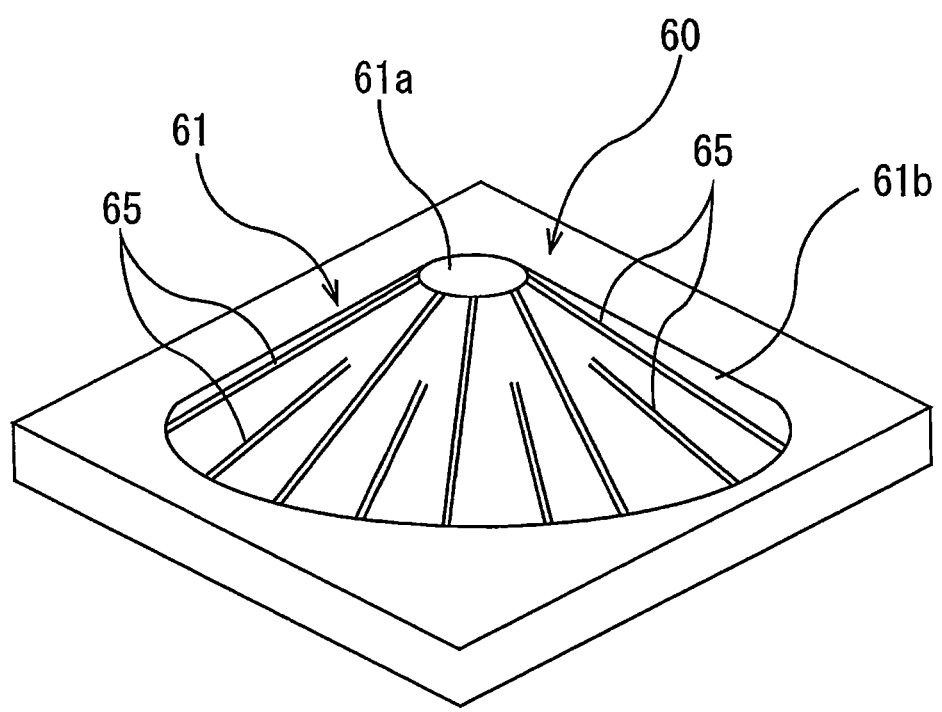
FIG. 8 is a perspective view showing still another embodiment of the cleaning element.

FIG. 8 is a perspective view showing still another embodiment of cleaning element 60. Structures, which will not be described particularly, are the same as those shown in FIG. 3. The cleaning element 60 according to this embodiment has a plurality of radially extending grooves 65 formed on the cleaning surface 61. These grooves 65 are arranged around central portion 61a of the cleaning surface 61. More specifically, the grooves 65 are formed on slope portion 61b surrounding the central portion 61a of the cleaning surface 61. The pure water, which has been supplied from the pure water supply nozzle 70 to the pen-sponge 42, flows down, together with the particles, in the radially extending grooves 65, thereby removing the particles rapidly from the cleaning element 60. Therefore, the cleaning element 60 according to this embodiment can more effectively prevent the particles from being reattached to the pen-sponge 42.

Figure 9:
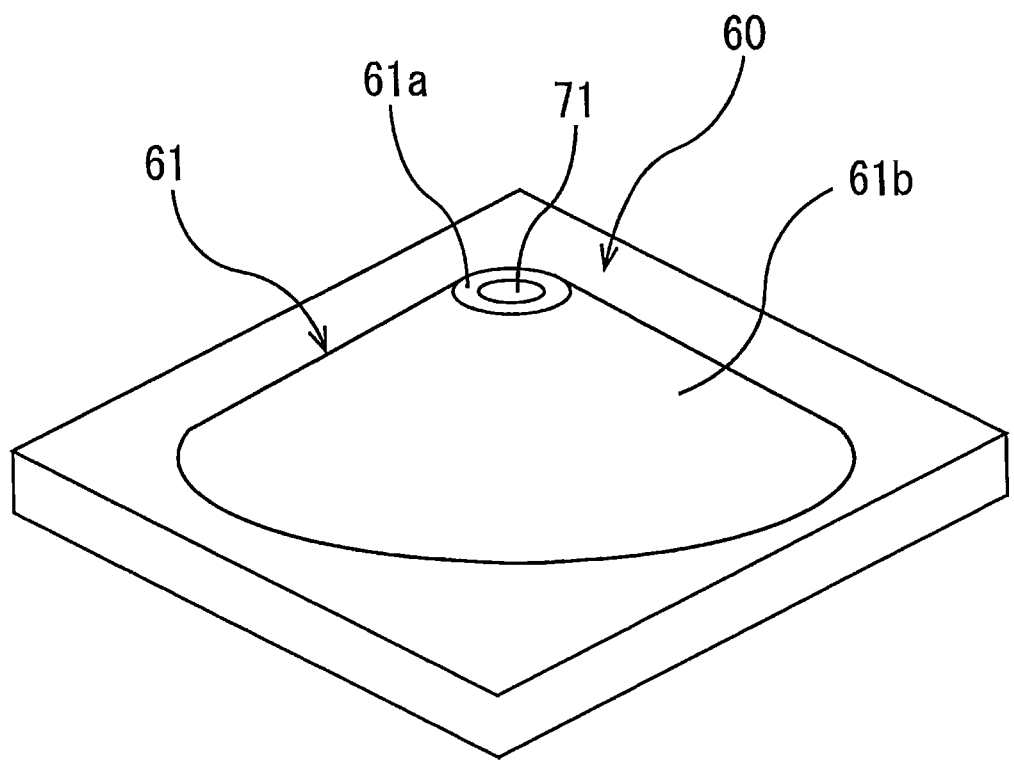
FIG. 9 is a perspective view showing still another embodiment of the cleaning element.
Figure 10:
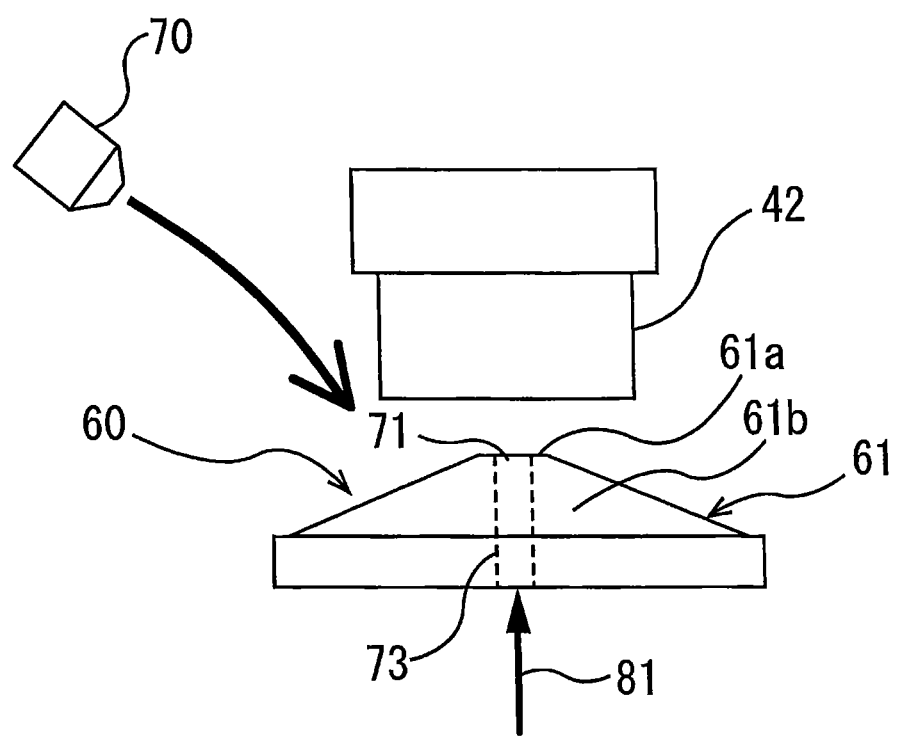
FIG. 10 is a side view of the cleaning element shown in FIG. 9.

FIG. 9 is a perspective view showing still another embodiment of cleaning element 60. FIG. 10 is a side view of the cleaning element 60 shown in FIG. 9. Structures, which will not be described particularly, are the same as those shown in FIG. 3. The cleaning element 60 has a central outlet 71 located in central portion 61a of cleaning surface 61, and a fluid passage 73 communicating with the central outlet 71. Further, a fluid supply line 81 for supplying fluid to the fluid passage 73 is coupled to the cleaning element 60. One end of the fluid passage 73 communicates with the central outlet 71, and the other end of the fluid passage 73 communicates with the fluid supply line 81. The central outlet 71 and the fluid passage 73 may be formed integrally. The fluid may be liquid (e.g., a high-pressure liquid) or two fluids (i.e., a mixture of gas and liquid). The two fluids may be referred to as binary fluid. In a case where the liquid is used as the fluid, the fluid supply line 81 serves as a liquid supply line, and in a case where the two fluids are used as the fluid, the fluid supply line 81 serves as a two-fluid supply line.

Figure 11:
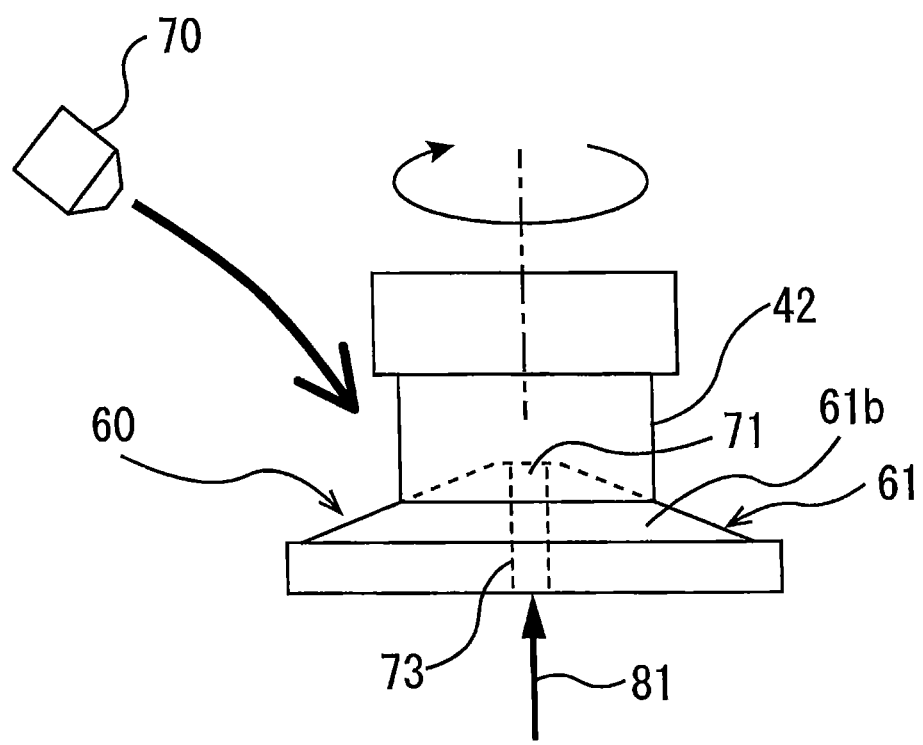
FIG. 11 is a view showing a state in which the pen-sponge is pressed against a cleaning surface of the cleaning element shown in FIG. 9 while the pen-sponge is being rotated.

FIG. 11 is a view showing a state in which the pen-sponge 42 is pressed against the cleaning surface 61 of the cleaning element 60 shown in FIG. 9 while the pen-sponge 42 is being rotated. As shown in FIG. 11, during the cleaning of the pen-sponge 42, the pure water is supplied from the pure water supply nozzle 70 to a side surface of the pen-sponge 42, while the fluid (i.e., liquid or two fluids) is supplied from the central outlet 71 of the cleaning element 60 to the central area of the lower surface (i.e., the scrubbing surface) of the pen-sponge 42. Therefore, the cleaning element 60 according to this embodiment can more effectively clean the central area of the pen-sponge 42.

Figure 12:
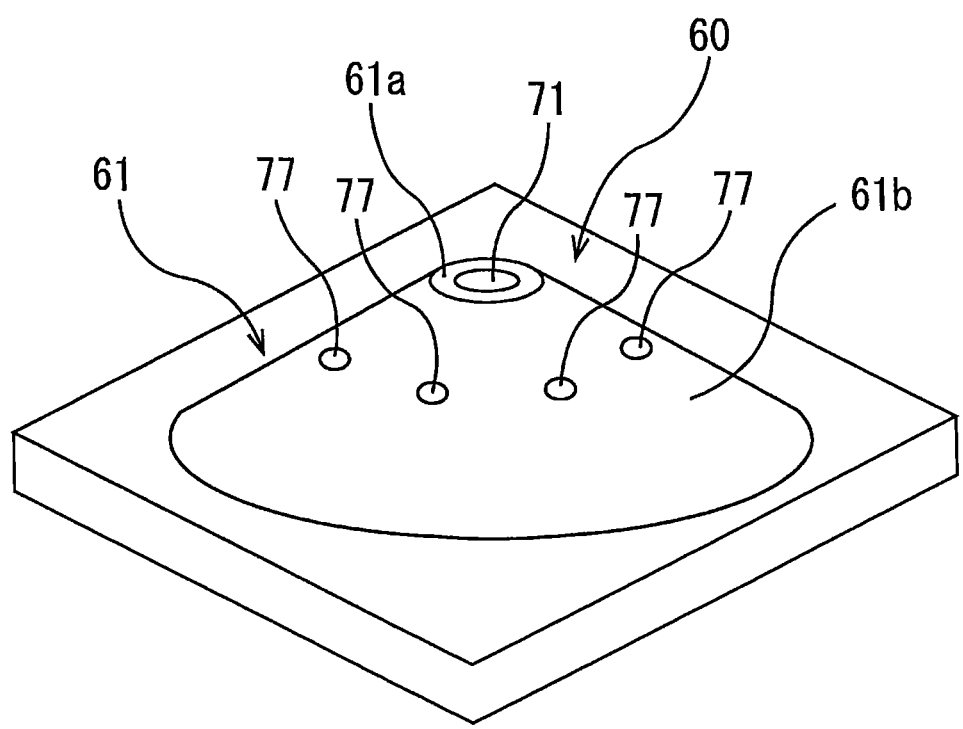
FIG. 12 is a perspective view showing cleaning element having a central outlet and a plurality of outer outlets arranged around the central outlet.
Figure 13:
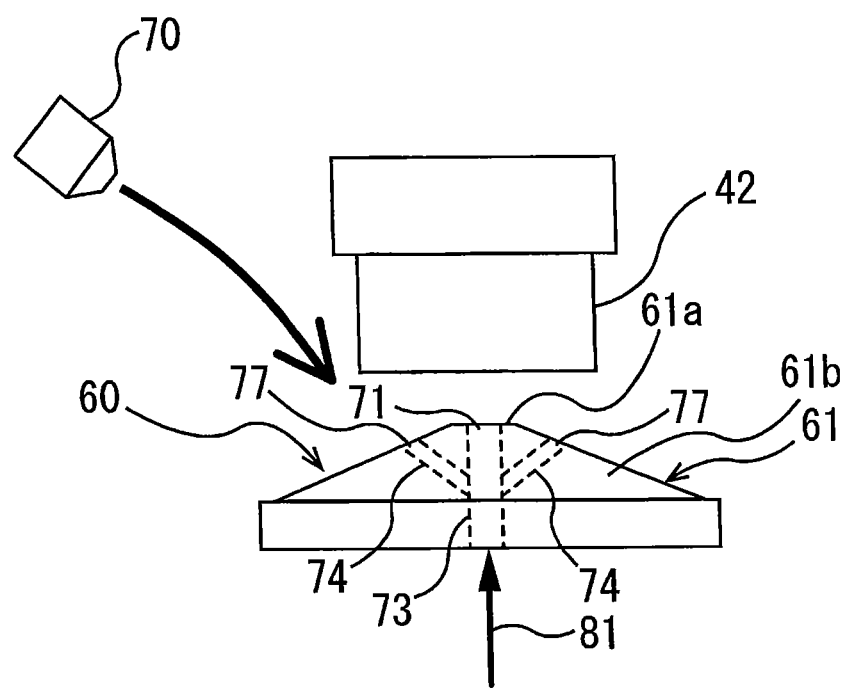
FIG. 13 is a side view of the cleaning element shown in FIG. 12.

As shown in FIGS. 12 and 13, the cleaning element 60 may further have a plurality of outer outlets 77 arranged outside the central portion 61a of the cleaning surface 61. These outer outlets 77 communicate with the fluid passage 73 through branch passages 74. The outer outlets 77 are arranged around the central outlet 71, and are located in the slope portion 61b. The fluid (i.e., liquid or two fluids) is supplied from the central outlet 71 to the central area of the lower surface (scrubbing surface) of the pen-sponge 42, and at the same time, the fluid is supplied from the outer outlets 77 to the circumferential area of the lower surface of the pen-sponge 42. Therefore, the cleaning element 60 according to this embodiment can more effectively clean the entire lower surface of the pen-sponge 42.

Figure 14:
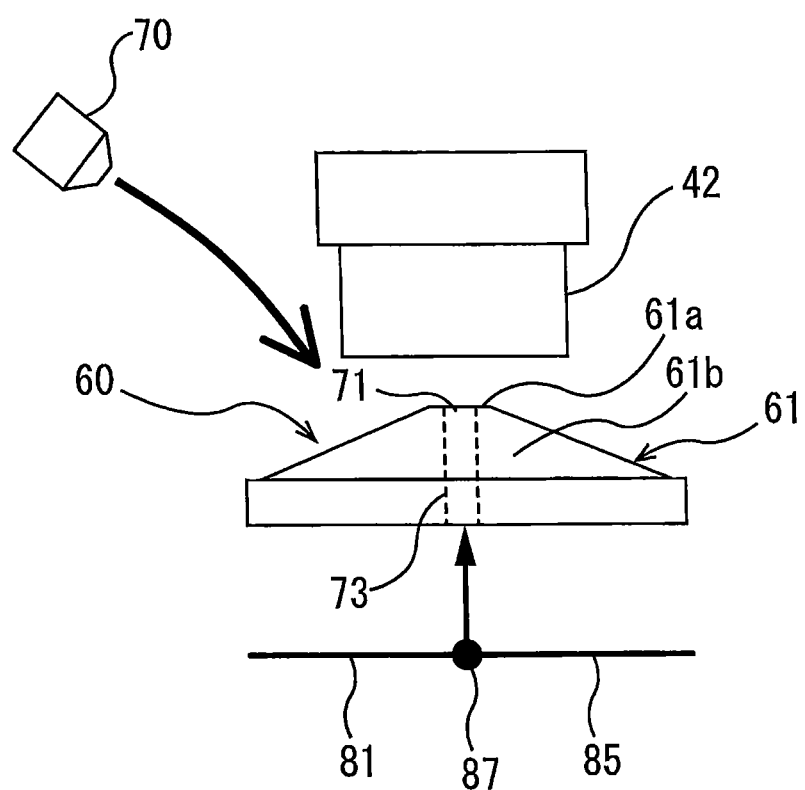
FIG. 14 is a view showing an example in which a fluid supply line and a gas supply line are coupled to a fluid passage of the cleaning element.

As shown in FIG. 14, in addition to the above-mentioned fluid supply line 81, a gas supply line 85 may be coupled to the fluid passage 73 of the cleaning element 60. The fluid supply line 81 and the gas supply line 85 are coupled to the fluid passage 73 through a three-way valve 87. With this configuration, by operating the three-way valve 87, either the fluid supply line 81 or the gas supply line 85 communicates with the fluid passage 73. The three-way valve 87 is operated manually or by an actuator (not shown).

The gas supply line 85 supplies gas (e.g., inert gas, such as nitrogen gas, or clean air) to the fluid passage 73, and the gas is ejected from the central outlet 71 (and the outer outlets 77) to the pen-sponge 42. It is preferable to supply the gas to the pen-sponge 42 after the liquid or two fluids is supplied to the pen-sponge 42. For example, the liquid or two fluids is supplied to the pen-sponge 42 while the pen-sponge 42 is rotated and pressed against the cleaning element 60, and a jet of the gas is then delivered onto the lower surface of the pen-sponge 42 while the pen-sponge 42 is being moved away from the cleaning element 60. The jet of the gas can remove liquid containing the particles from the pen-sponge 42.

Figure 15:
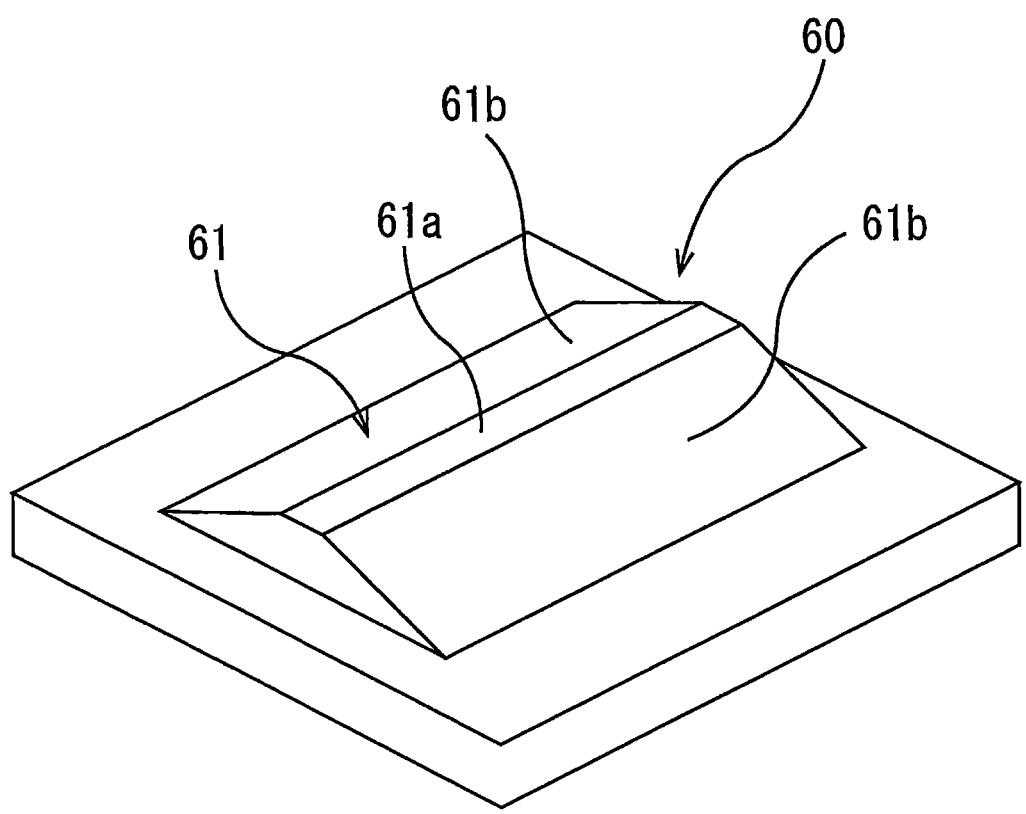
FIG. 15 is a perspective view showing still another embodiment of cleaning element.
Figure 16:
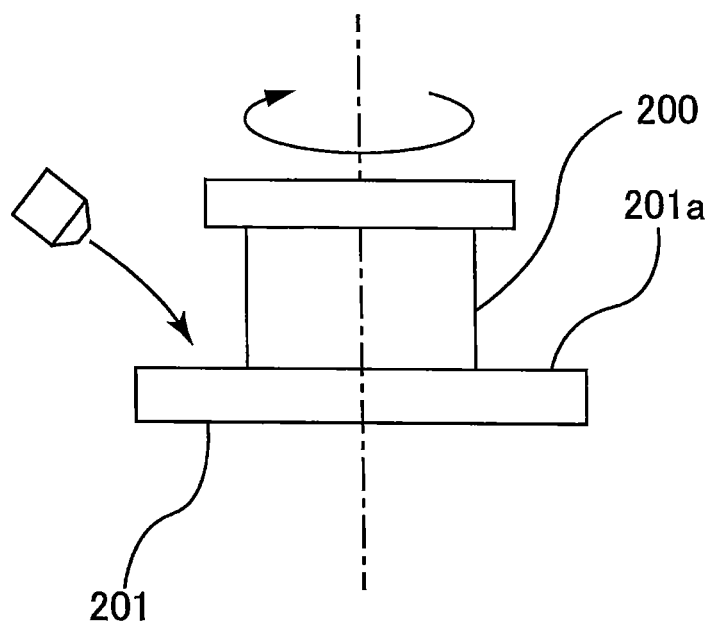
FIG. 16 is a schematic view showing a conventional cleaning element for cleaning a pen-sponge.

FIG. 15 is a perspective view showing still another embodiment of cleaning element 60. Structures, which will not be described particularly, are the same as those shown in FIG. 3. The cleaning element 60 according to this embodiment has cleaning surface 61 in the shape of roof, and the cleaning surface 61 has a rectangular shape when it is viewed from above. More specifically, the cleaning surface 61 of the cleaning element 60 includes an elongated central portion 61a extending horizontally in the center of the cleaning surface 61, and two rectangular slope portions 61b extending outwardly from both sides of the central portion 61a with a downward gradient. In this cleaning element 60 also, the central portion 61a of the cleaning surface 61 lies at a higher position than the slope portions 61b outside the central portion 61a.

In the above-discussed embodiments, the pen-sponge 42 is pressed against the upper surface (i.e., the cleaning surface) of the cleaning element 60 while the pen-sponge 42 is being rotated about its central axis. In another embodiment, the pen-sponge 42 may be pressed against the upper surface (i.e., the cleaning surface) of the cleaning element 60 while the pen-sponge 42 is not rotated.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate cleaning apparatus comprising:
a substrate holder configured to hold and rotate a substrate;
a sponge cleaning tool to be brought into contact with a surface of the substrate;
a cleaning element provided adjacent to the substrate held by the substrate holder; and
a cleaning-tool moving mechanism configured to bring the sponge cleaning tool into contact with the cleaning element, the cleaning element having a cleaning surface that is to come in contact with the sponge cleaning tool, and a central portion of the cleaning surface being located at a higher position than a portion, of the cleaning surface, outside the central portion,
wherein the cleaning element has a central outlet located in the central portion of the cleaning surface, and a fluid passage communicating with the central outlet, and
a fluid supply line, which is configured to supply fluid to the fluid passage, is coupled to the cleaning element.

2. The substrate cleaning apparatus according to claim 1, wherein the portion outside the central portion is a slope portion extending outwardly from the central portion and inclined downwardly.

3. The substrate cleaning apparatus according to claim 1, wherein a plurality of radially extending grooves are formed on the cleaning surface.

4. The substrate cleaning apparatus according to claim 1, wherein the fluid supply line is a liquid supply line configured to supply a liquid to the fluid passage.

5. The substrate cleaning apparatus according to claim 1, wherein the fluid supply line is a two-fluid supply line configured to supply two fluids to the fluid passage.

6. The substrate cleaning apparatus according to claim 1, wherein a gas supply line configured to supply a gas to the fluid passage is further coupled to the cleaning element.

7. The substrate cleaning apparatus according to claim 1, wherein:
the cleaning element further has outer outlets provided outside the central portion of the cleaning surface; and
the outer outlets communicate with the fluid passage.

8. The substrate cleaning apparatus according to claim 1, wherein the cleaning-tool moving mechanism is configured to bring the sponge cleaning tool into contact with the cleaning element when the sponge cleaning tool is rotating about its central axis.

9. A substrate processing apparatus comprising:
a polishing unit configured to polish a substrate; and
a substrate cleaning apparatus configured to clean the substrate polished by the polishing unit,
the substrate cleaning apparatus including:
(i) a substrate holder configured to hold and rotate the substrate;
(ii) a sponge cleaning tool to be brought into contact with a surface of the substrate;
(iii) a cleaning element provided adjacent to the substrate held by the substrate holder; and
(iv) a cleaning-tool moving mechanism configured to bring the sponge cleaning tool into contact with the cleaning element, the cleaning element having a cleaning surface that is to come in contact with the sponge cleaning tool, and a central portion of the cleaning surface being located at a higher position than a portion, of the cleaning surface, outside the central portion,
wherein the cleaning element has a central outlet located in the central portion of the cleaning surface, and a fluid passage communicating with the central outlet; and
a fluid supply line, which is configured to supply fluid to the fluid passage, is coupled to the cleaning element.

10. The substrate processing apparatus according to claim 9, wherein the portion outside the central portion is a slope portion extending outwardly from the central portion and inclined downwardly.

11. The substrate processing apparatus according to claim 9, wherein a plurality of radially extending grooves are formed on the cleaning surface.

12. The substrate processing apparatus according to claim 9, wherein the fluid supply line is a liquid supply line configured to supply a liquid to the fluid passage.

13. The substrate processing apparatus according to claim 9, wherein the fluid supply line is a two-fluid supply line configured to supply two fluids to the fluid passage.

14. The substrate processing apparatus according to claim 9, wherein a gas supply line configured to supply a gas to the fluid passage is further coupled to the cleaning element.

15. The substrate processing apparatus according to claim 9, wherein:
the cleaning element further has outer outlets provided outside the central portion of the cleaning surface; and
the outer outlets communicate with the fluid passage.

16. The substrate processing apparatus according to claim 9, wherein the cleaning-tool moving mechanism is configured to bring the sponge cleaning tool into contact with the cleaning element when the sponge cleaning tool is rotating about its central axis.

* * * * *

UNITED STATES PATENT AND TRADEMARK OFFICE
CERTIFICATE OF CORRECTION

PATENT NO.        : 9,466,512 B2  
APPLICATION NO.   : 14/573390  
DATED             : October 11, 2016  
INVENTOR(S)       : Ishibashi It is certified that error appears in the above-identified patent and that said Letters Patent is hereby corrected as shown below:

In the Specification

Column 7, Line 67: delete "61 a" and replace it with -- 61a --

Signed and Sealed this  
Twenty-fourth Day of January, 2017

Michelle K. Lee  
*Director of the United States Patent and Trademark Office*